(12) United States Patent
Hosokawa et al.

(10) Patent No.: US 7,235,888 B2
(45) Date of Patent: Jun. 26, 2007

(54) METHOD FOR MANUFACTURING SEMICONDUCTOR DEVICE, ADHESIVE SHEET FOR USE THEREIN AND SEMICONDUCTOR DEVICE

(75) Inventors: Kazuhito Hosokawa, Ibaraki (JP); Takuji Okeyui, Ibaraki (JP); Hirofumi Fujii, Ibaraki (JP); Yasuhiko Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 169 days.

(21) Appl. No.: 11/032,290

(22) Filed: Jan. 10, 2005

(65) Prior Publication Data

US 2005/0133824 A1    Jun. 23, 2005

Related U.S. Application Data

(62) Division of application No. 10/611,290, filed on Jul. 1, 2003, now Pat. No. 6,858,473.

(30) Foreign Application Priority Data

Jul. 26, 2002    (JP)    .............................. 2002-217680

(51) Int. Cl.
   *H01L 29/40*    (2006.01)
   *H01L 21/48*    (2006.01)
(52) U.S. Cl. ...................................... 257/783; 438/114
(58) Field of Classification Search ........ 257/779–786; 438/118, 124, 464, 611
See application file for complete search history.

(56) References Cited

U.S. PATENT DOCUMENTS 6,001,671 A * 12/1999 Fjelstad ...................... 438/112
6,294,100 B1    9/2001 Fan et al.
6,348,726 B1 *  2/2002 Bayan et al. ................ 257/666
6,475,629 B1   11/2002 Takeuchi et al.
6,498,392 B2   12/2002 Azuma
6,683,298 B1    1/2004 Hunter et al.
6,706,547 B2 *  3/2004 Sakamoto et al. ............ 438/33
2002/0146864 A1 10/2002 Miyaki et al.
2003/0092253 A1  5/2003 Yamaguchi

FOREIGN PATENT DOCUMENTS

JP    9-252014    9/1997

(Continued)

OTHER PUBLICATIONS

Japanese Patent Office Action issued on the corresponding Japanese Patent Application No. 2002-217680, dated May 16, 2006.

(Continued)

*Primary Examiner*—Calvin Lee
(74) *Attorney, Agent, or Firm*—Knobbe Martens Olson & Bear LLP (57) ABSTRACT

A series of semiconductor devices includes: (i) a plurality of semiconductor elements having electrodes; (ii) a plurality of electrically conductive parts formed around and electrically connected to each of the semiconductor elements; and (iii) a sealing resin in which the plurality of semiconductor elements and the plurality of electrically conductive parts are sealed and an electrode-free side of each semiconductor element and an unwired side of each electrically conductive part are formed on a single flat surface of a removable substrate.

13 Claims, 8 Drawing Sheets

FOREIGN PATENT DOCUMENTS

| | | |
|---|---|---|
| JP | 10-012773 | 1/1998 |
| JP | 10-098133 | 4/1998 |
| JP | 10-209190 | 8/1998 |
| JP | 11-121646 | 4/1999 |
| JP | 2001-210743 | 8/2001 |

OTHER PUBLICATIONS

Chinese Patent Office Action issued on the corresponding Chinese Patent Application No. 031784593, issued on Sep. 8, 2006.

* cited by examiner

(Unit:mm)

FIG.9

Prior Art

FIG. 10

Prior Art

METHOD FOR MANUFACTURING SEMICONDUCTOR DEVICE, ADHESIVE SHEET FOR USE THEREIN AND SEMICONDUCTOR DEVICE

CROSS-REFERENCE TO RELATED APPLICATION

This is a divisional of U.S. application Ser. No. 10/611,290 filed on Jul. 1, 2003 now U.S. Pat. No. 6,858,473, and the disclosure of which is hereby incorporated by reference in its entirety.

BACKGROUND OF THE INVENTION

1. Field of the Invention

The present invention relates to a method for manufacturing a surface mount type semiconductor device with leadless structure. In particular, this invention relates to a method for manufacturing a thin semiconductor device with low-cost. This invention also relates to an adhesive sheet for use in such a method for manufacturing a semiconductor device. This invention further relates to a surface mount type semiconductor device with leadless structure, which is thin and with low-cost.

2. Description of the Related Art

Packages of individual components such as semiconductor integrated circuits, transistors, and diodes have been made smaller and thinner. In the field of semiconductor integrated circuits with lead frames, there has been a demand for a finer lead pitch of the lead frames for the purpose of forming a larger number of pins. If the lead width is reduced to meet such a demand, however, the strength of the lead is reduced so that the lead can bend to form a short circuit. A certain lead pitch should also be fixed, and therefore the packages should have a relatively large size. Thus, the packages with the lead frame have been relatively large in size and relatively thick. For the purpose of excluding the influence of the lead frame, therefore, surface mount type semiconductor devices with leadless structure have been proposed.

Figure 9:
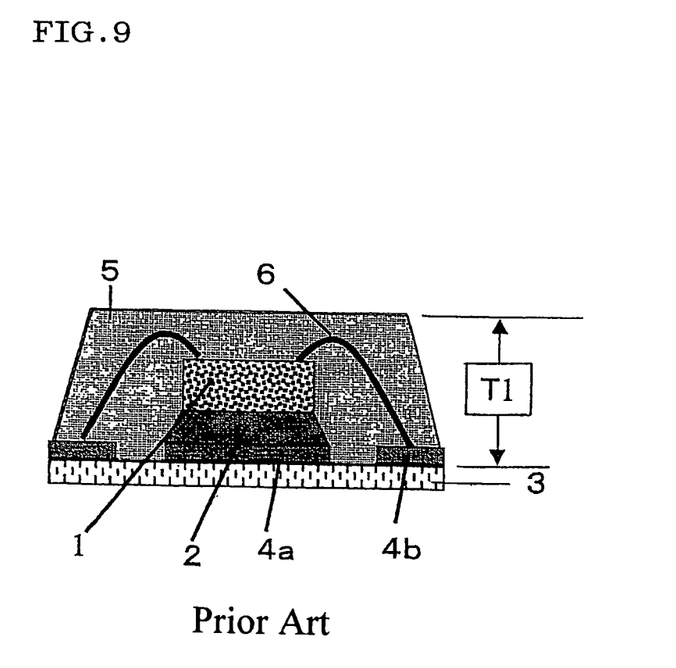
FIGS. 9 and 10 are sectional views showing conventional semiconductor devices, respectively.

Japanese Patent Laid-Open No. 9-252014 (1997) discloses an example of the leadless semiconductor device as shown in FIG. 9. The method for manufacturing such a semiconductor device includes the steps of attaching a metal foil to a base member 3; etching the metal foil so as to leave certain portions thereof; using an adhesive 2 to fix a semiconductor element 1 to a metal foil portion (die pad) 4a, which is substantially the same in size as the semiconductor element 1; electrically connecting wires 6 between the semiconductor element 1 and metal foil portions 4b; performing transfer molding with a sealing resin 5 in dies; and finally separating the molded sealing resin from the base member 3 to form a packaged semiconductor element. However, the semiconductor device produced by this method includes the adhesive 2 and the metal foil portion (die pad) 4a associated with the semiconductor element 1. Such a structure may still have a problem in satisfying the demand for small thin semiconductor devices in the industrial field.

In the process disclosed in the publication, the base member 3 has to sufficiently adhere to the metal foil portions 4a and 4b during the step of etching the metal foil and the step of transfer molding with the sealing resin. After the transfer molding step, on the other hand, the base member 3 has to be easily detached from the molded resin 5 and from the metal foil portions 4a and 4b. Thus, contrary properties are required about the contact between the base member 3 and the metal foil portions 4a and 4b. Specifically, the adhesion is required to be durable to etching chemicals and to be so durable as not to allow the semiconductor element 1 to shift at high temperature under a pressure applied by the mold resin running in the dies in the transfer molding step. In contrast, after the resin molding, the base member 3 must easily be separated from the molded resin 5 and from the metal foil portions 4a and 4b. However, the material of the base member 3 such as a fluoropolymer, silicone, and a fluoro-coated metal as disclosed in the publication can never satisfy the above contrary requirements for the contact.

Figure 10:
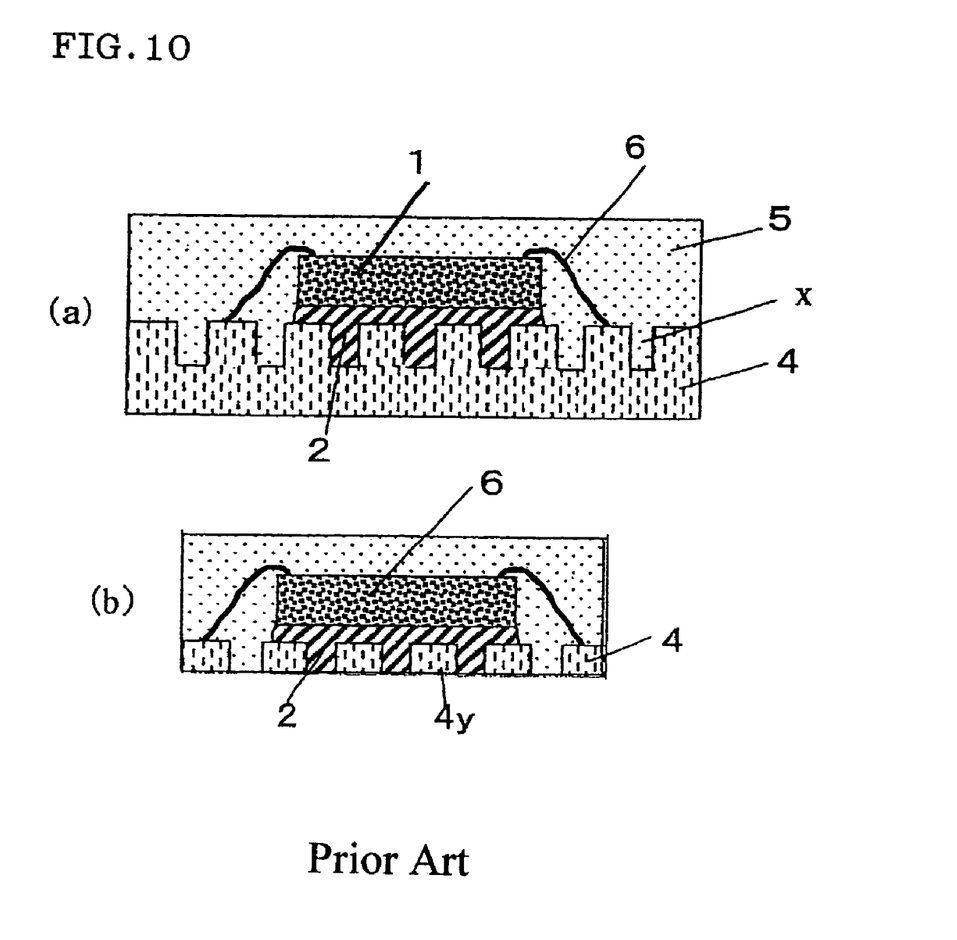

Japanese Patent Laid-Open No. 2001-210743 discloses another example of the leadless semiconductor device and a manufacturing process thereof. FIG. 10 shows one of the semiconductor devices as disclosed in this publication. Such a semiconductor device is fabricated as follows. A metal plate 4 with a matrix of grooves x is prepared as a base member. A semiconductor element 1 is fixed to the metal plate 4 using an adhesive 2. Wires 6 are provided by wire bonding at designed necessary portions and then sealed in a sealing resin 5 (FIG. 10 at (a)). The metal plate 4 and the adhesive 2 are then ground, and the sealing resin 5 and the metal plate 4 are cut in a designed size to form a semiconductor device (FIG. 10 at (b)). However, the semiconductor device produced by this process also includes the adhesive layer 2 and the metal plate 4y coexisting under the semiconductor element 1. Such a structure may still have a problem in satisfying the demand for thin semiconductor devices in the industrial field.

As described above, the conventional manufacturing process has difficulty in achieving thinner semiconductor devices. In the conventional process, therefore, the semiconductor element itself should be ground into a thin form in order to form a thin semiconductor device. In such a process, therefore, cracking or chipping may often occur in chips, which can cause to increase in cost. The use of the adhesive and the like also involves additional steps and materials, which can also cause to increase in cost.

It is an object of the present invention to provide a manufacturing process that can produce a surface mount type semiconductor device with leadless structure, in a thinner form.

It is another object of this invention to provide an adhesive sheet useful for such a manufacturing process.

It is yet another object of this invention to provide a surface mount type semiconductor device with leadless structure, in a thin form.

SUMMARY OF THE INVENTION

The inventors have made active investigations to solve the above problems and found the manufacturing process as described below to make this invention.

This invention is therefore directed to a method for manufacturing a semiconductor device, including the steps of:

(1) forming a plurality of electrically conductive parts on portions of an adhesive layer of an adhesive sheet, the adhesive sheet having a base layer and the adhesive layer;

(2) attaching at least one semiconductor element having electrodes to the adhesive layer, wherein an electrode-free side of the semiconductor element is attached to the adhesive layer;

(3) electrically connecting a wire between each of the electrically conductive parts and each of the electrodes of the semiconductor element;
(4) sealing the semiconductor element in a sealing resin to form a semiconductor device on the adhesive sheet; and
(5) separating the adhesive sheet from the semiconductor device.

In the step (2) of the manufacturing method according to this invention, the semiconductor element is attached to the adhesive layer of the adhesive sheet, which serves as a supporting member. In the step (5) of the manufacturing method, the adhesive sheet is detached from the formed semiconductor device. The manufacturing method of this invention is free from the metal (die pad) and the adhesive layer that have been additionally incorporated into the conventional process to fix the semiconductor element. Therefore, the method of this invention can produce a thinner semiconductor device.

The semiconductor element attached to the adhesive sheet is prevented from shifting in the transfer step and the like. In the step (4) such as the step of transfer-molding a sealing resin, the semiconductor element is also prevented from shifting at a high temperature under a high pressure generated when the resin runs in dies.

In the conventional technique, the semiconductor element itself is excessively ground for the purpose of forming a thin semiconductor device, because of the addition of the die pad and the adhesive. In contrast, the method of this invention involves no such excessive grind to produce a thin semiconductor device and therefore can be performed with less cracking or chipping of the semiconductor element. The manufacturing method of this invention requires no excessive material such as an adhesive and therefore can be advantageous in cost reduction. The manufacturing method free from the step using excessive materials is also simple and advantageous.

In the method for manufacturing the semiconductor device, a region of the adhesive layer attaching the semiconductor element is preferably covered with a protective layer before the step (2).

In general, the manufacturing process of the semiconductor element itself is performed in an air particle-free clean environment. However, such a strictly clean environment may not be used in the process of fabricating the semiconductor device. In such a case, foreign matters tend to be deposited on the adhesive layer. If the protective layer is placed on a region of the adhesive layer until the semiconductor element is attached to the region, incoming of the foreign matters between the semiconductor element and the adhesive layer can be prevented.

In the method for manufacturing the semiconductor device, the base layer of the adhesive sheet preferably has an elastic modulus of 0.3 GPa or more at 150° C., and the adhesive layer of the adhesive sheet preferably has an elastic modulus of 0.1 MPa or more at 150° C.

The step of sealing the semiconductor element in a resin such as the step (4) may be performed at a high temperature of about 150 to about 180° C. It is therefore preferred that the adhesive sheet including the base layer and the adhesive layer each with the above elastic modulus has a good heat resistance. In this respect, the base layer preferably has an elastic modulus of 0.3 GPa or more, more preferably 0.5 GPa or more, further more preferably 1 GPa or more. In general, the elastic modulus of the base layer is preferably from about 0.3 to about 100 GPa. The adhesive layer preferably has an elastic modulus of 0.1 MPa or more, more preferably 0.5 MPa or more, further more preferably 1 MPa or more. In general, the elastic modulus of the adhesive layer is preferably from about 0.1 to about 10 MPa. The adhesive layer with such an elastic modulus can resist softening or flowing in the step (4) and the like so that the molding can be carried out in a more stable manner. The elastic modulus is specifically determined by the method as described in the section of Examples.

In the method for manufacturing the semiconductor device, the adhesive layer of the adhesive sheet preferably has an adhesive strength of 0.2 to 10 N/10 mm to a silicon mirror wafer.

The adhesive sheet with such an adhesive strength is appropriate in adhesion. During the steps (1) to (4), the semiconductor element attached to the adhesive layer of such a sheet can resist shifting. In the step (5), the semiconductor device can easily be detached from the adhesive sheet with such an adhesive strength so that the semiconductor device can be formed with less damage. The adhesive strength is preferably from 0.2 to 10 N/10 mm, more preferably from 0.2 to 2 N/10 mm. The adhesive strength is specifically determined by the method as described in the section of Examples.

This invention is also directed to an adhesive sheet for use in the method for manufacturing the semiconductor device, comprising a base layer and an adhesive layer.

The inventive sheet is suitably used in the inventive method for manufacturing the semiconductor device. As described above, the base layer of the adhesive sheet preferably has an elastic modulus of 0.3 GPa or more at 150° C., and the adhesive layer of the adhesive sheet preferably has an elastic modulus of 0.1 MPa or more at 150° C. In the manufacturing process of the semiconductor device, the step of sealing the semiconductor element in a resin such as the step (4) may be performed at a high temperature of about 150 to about 180° C. It is therefore preferred that the adhesive sheet including the base layer and the adhesive layer each with the above elastic modulus has a good heat resistance. In this respect, the base layer preferably has an elastic modulus of 0.3 GPa or more, more preferably 0.5 GPa or more, further more preferably 1 GPa or more. In general, the elastic modulus of the base layer is preferably from about 0.3 to about 100 GPa. The adhesive layer preferably has an elastic modulus of 0.1 MPa or more, more preferably 0.5 MPa or more, further more preferably 1 MPa or more. In general, the elastic modulus of the adhesive layer is preferably from about 0.1 to about 10 MPa. The adhesive layer with such an elastic modulus can resist softening or flowing in the step (4) and the like so that the molding can be carried out in a more stable manner. The elastic modulus is specifically determined by the method as described in the section of Examples.

The adhesive strength of the adhesive layer to a silicon mirror wafer is preferably from 0.2 to 10 N/10 mm, more preferably from 0.2 to 2 N/10 mm.

This invention is also directed to a semiconductor device, including: a semiconductor element having electrodes; electrically conductive parts each electrically connected to each electrode of the semiconductor element by a wire; and a sealing resin in which the semiconductor element and the electrically conductive parts are sealed in such a manner that an electrode-free side of the semiconductor element and an unwired side of each electrically conductive part are exposed at the same surface, wherein the semiconductor device may be formed by the steps of:

(1) forming a plurality of electrically conductive parts on portions of an adhesive layer of an adhesive sheet, the adhesive sheet having a base layer and the adhesive layer;

(2) attaching at least one semiconductor element having electrodes to the adhesive layer, wherein an electrode-free side of the semiconductor element is attached to the adhesive layer;

(3) electrically connecting a wire between each of the electrically conductive parts and each of the electrodes of the semiconductor element;

(4) sealing the semiconductor element in a sealing resin to form a semiconductor device on the adhesive sheet; and (5) separating the adhesive sheet from the semiconductor device.

Figure 1A:
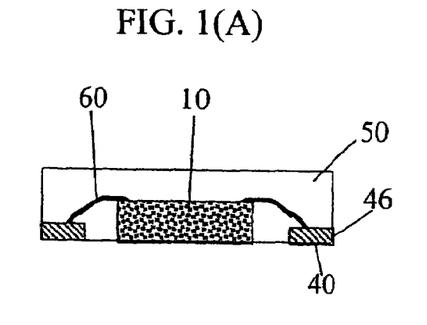
FIGS. 1(A) and 1(B) are sectional views showing semiconductor devices according to the present invention.
Figure 1B:
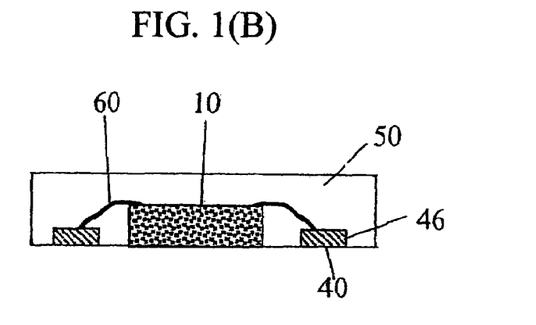

As shown in FIGS. 1(A) and 1(B), a semiconductor element 10 and electrically conductive parts 40 are exposed at the same surface of the semiconductor device according to this invention. Such a device is thin, because it is free of the metal (die pad) and the adhesive layer that have been additionally incorporated in the conventional device. Such a semiconductor device may be formed by any process, specifically, the process including the steps (1) to (5).

DETAILED DESCRIPTION OF THE PREFERRED EMBODIMENT

Referring to the drawings, embodiments of this invention including the semiconductor device and the manufacturing process thereof are specifically described below. First of all, the structure of the semiconductor device according to this invention is described with reference to FIGS. 1(A) and 1(B), which are sectional drawings showing semiconductor devices according to this invention.

A semiconductor element 10 is electrically connected to electrically conductive parts 40 by wiring of each wire 60. The semiconductor element 10 has electrodes (not shown) formed on the upper side. The semiconductor element 10 and wires 60 are sealed in a sealing resin 50 for protecting them against external environment. The under faces of the semiconductor element 10 and the electrically conductive parts 40 are exposed at the surface of the molded sealing resin 50. In such a structure, the electrode-free side of the semiconductor element 10 and the unwired side of each electrically conductive part 40 are flush with the same surface. Thus, the semiconductor device of this invention has neither die pad nor adhesive layer for bonding the semiconductor element.

The structures as shown in FIGS. 1(A) and 1(B) differ in that a side face 46 of each electrically conductive part 40 is exposed in the FIG. 1(A) structure but embedded in the FIG. 1(B) structure. Further details about the difference between FIGS. 1(A) and 1(B) are described later.

The conventional semiconductor device has the die pad about 100 to about 200 µm in thickness and the semiconductor element-bonding adhesive layer about 10 to about 50 µm in thickness. According to this invention, therefore, the thickness of the semiconductor device can be reduced by 110 to 250 µm, if the semiconductor element and the sealing resin over the semiconductor element each have the same thickness. The conventional structure as shown in FIG. 9 has a thickness T1 of about 300 to about 700 µm, in which the electrodes to be mounted on a circuit board are placed under the semiconductor element. Therefore, the reduction in thickness according to this invention should be very effective.

An example of the method for manufacturing the semiconductor device according to this invention including the steps (1) to (5) is described with reference to FIG. 2.

An adhesive sheet 30 having a base layer 32 and an adhesive layer 31 is subjected to the step (1) in which a plurality of electrically conductive parts 40 are formed on portions of the adhesive layer 31. Any of various methods may be used to perform the step (1) of forming the electrically conductive parts 40. For example, the following method may be used. Referring to FIG. 2 at (a), a metal foil 41 is attached to the adhesive layer 31 of the adhesive sheet 30. Referring to FIG. 2 at (b), pattern etching is then performed using general photolithography to form the electrically conductive parts 40. The metal foil 41 may be any material including any foil generally used in the field of semiconductors. Examples of such a foil include a copper foil, a copper-nickel alloy foil, a Fe—Ni alloy foil, and a Fe—Ni—Co alloy foil. If desired, a surface 42 of the metal foil 41 to be in contact with the adhesive layer 31 may be treated so as to have a suitable state for the process of mounting the semiconductor device on a board or the like.

Figure 2:
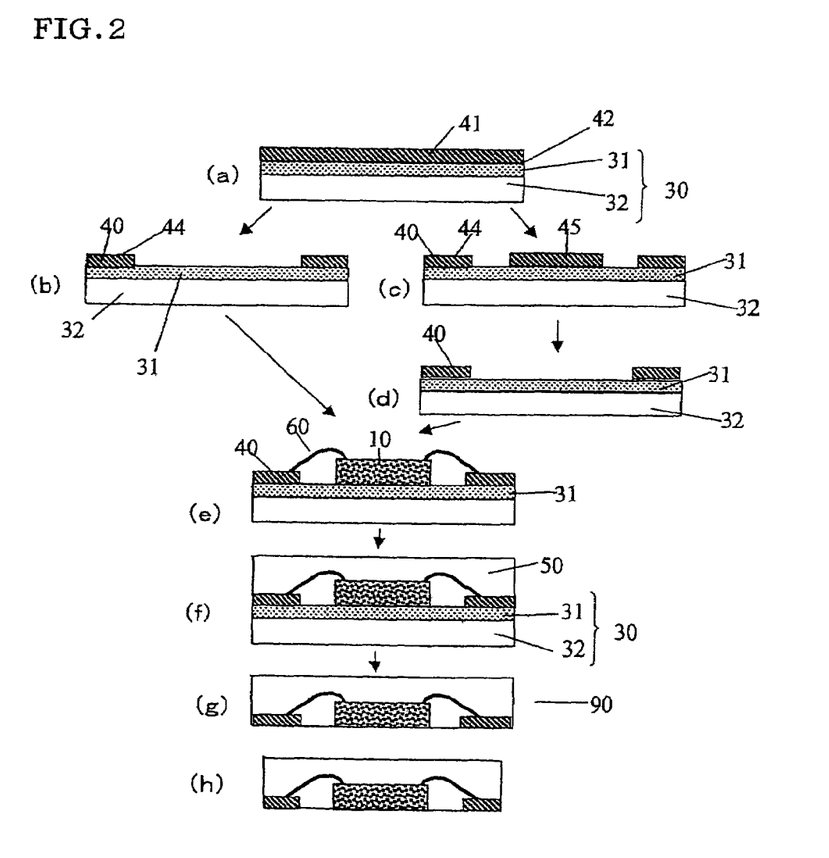
FIG. 2 is a schematic diagram showing a manufacturing process of a semiconductor device according to this invention.
Figure 3:
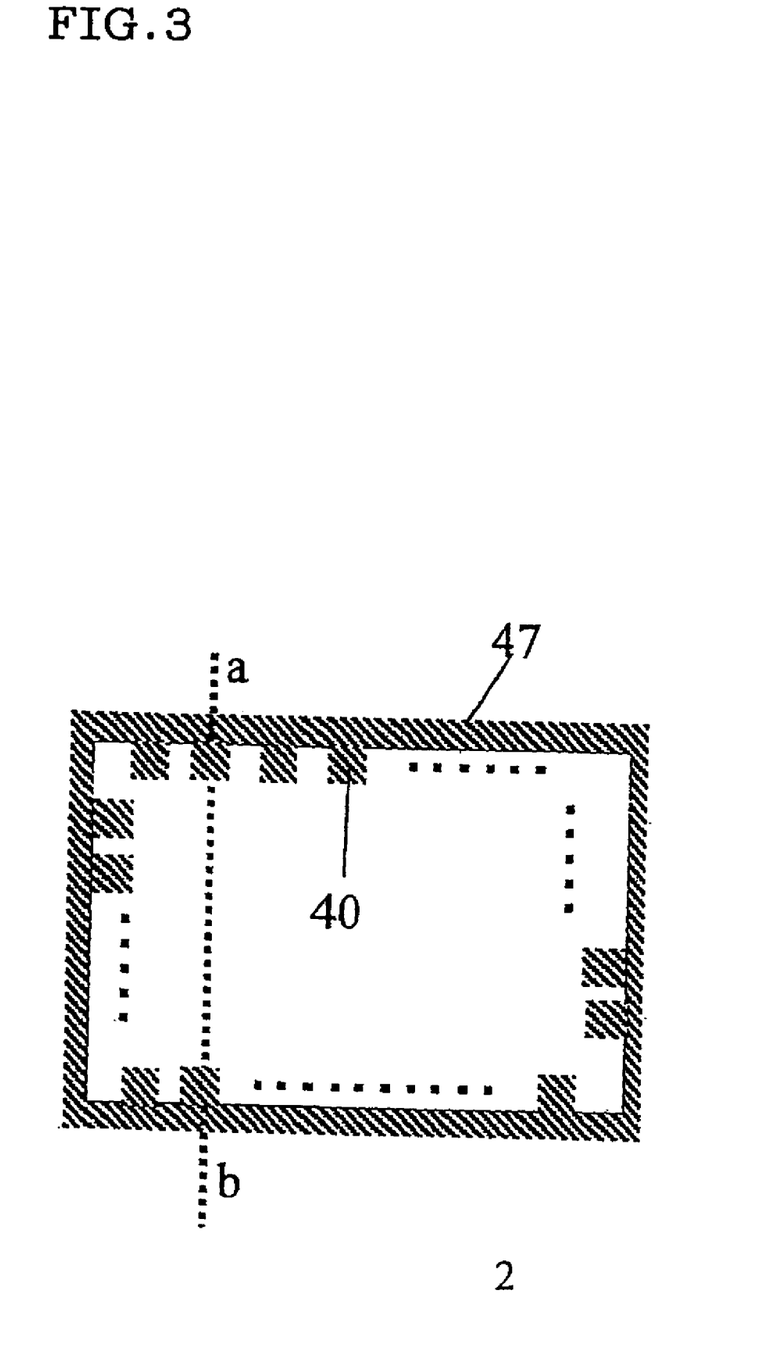
FIG. 3 is a top view schematically showing a semiconductor device according to this invention.

FIG. 3 is a plan view schematically showing the arrangement of the electrically conductive parts 40 as formed. The electrically conductive parts 40 are formed in certain numbers corresponding to the number of the electrodes of the semiconductor element 10. A plating lead 47 may be used to electrically connect and electroplate the electrically conductive parts 40. FIG. 2 at (b) is a sectional view along the broken line a–b of FIG. 3.

The step (2) is then performed in which at least one semiconductor element 10 having electrodes is attached to the adhesive layer 31 in such a manner that the electrode-free side of the semiconductor element 10 is in contact with the adhesive layer 31. The step (3) is further performed in which a wire 60 is provided to electrically connect each of the electrically conductive parts 40 to each of the electrodes of the semiconductor element 10. The steps (2) and (3) are shown in FIG. 2 at (e).

Before the step (2), the plating lead 47 may be used to form an electroplated layer on a surface 44 of each electrically conductive part 40 in an optimal manner for wire bonding. Such a plating process generally includes but is not limited to Ni plating and gold plating thereon.

The step (4) is then performed in which the semiconductor element 10 and the like are sealed in a sealing resin 50 to form a semiconductor device on the adhesive layer 31 of the adhesive sheet 30. The step of sealing in the sealing resin 50 may be performed by general transfer molding with dies. The step (4) is shown in FIG. 2 at (f). After the transfer molding, the molded resin may be heated for post cure as needed. The post cure heating may be performed before or after the step (5) (described below) of separating the adhesive sheet 30.

Figure 4:
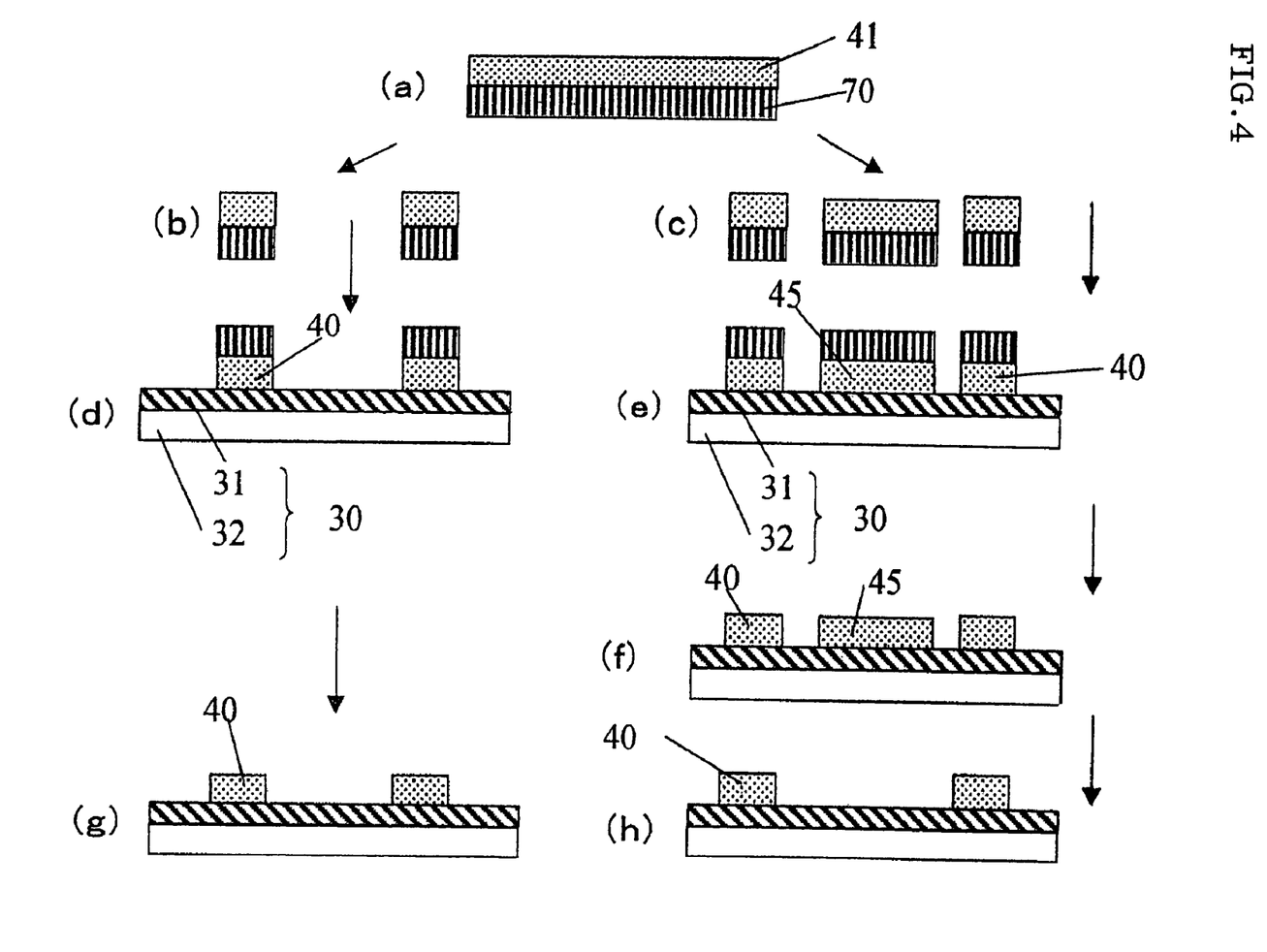
FIG. 4 is a diagram showing another example of the step (1) in the manufacturing process of the semiconductor device according to this invention.

The step (5) is then performed in which the adhesive sheet 30 is separated from the semiconductor device. This step provides a semiconductor device 90. The step (5) is shown in FIG. 4 at (g). In the case that the plating lead 47 is used, the portion of the plating lead is cut off so that the semiconductor device is provided (FIG. 2 at (h)). After the process as described above, a semiconductor device as shown in FIG. 1(A) is obtained. The step of cutting off the plating lead 47 may be performed before or after the step of separating the adhesive sheet 30.

The semiconductor device of this invention may be manufactured in the order of (a), (b), (e), (f), (g), and (h) in FIG. 2. As shown in FIG. 2 at (c), however, a protective layer 45 is preferably formed on a region of the adhesive layer 31 to be attached to the semiconductor element 10 prior to the step (2). The protective layer 45 advantageously prevents incoming of foreign matters between the semiconductor element 10 and the adhesive layer 31.

For example, the protective layer 45 may be formed by pattern etching of the metal foil 41. The step (1) as shown in FIG. 2 at (b) removes portions of the metal foil 41 by etching so as to expose a certain region to be attached to the semiconductor element 10 in pattern-etching to form the metal foil 40 as shown in FIG. 2. In contrast, the step of pattern-etching the metal foil as shown in FIG. 2 at (c) leaves the metal foil portion 45 not etched on the region to be attached to the semiconductor element 10. The remaining metal foil portion 45 forms the protective layer. The metal foil portion 45 is then peeled off in the step (2) (FIG. 2 at (d)). The way to peel off the protective layer 45 (the metal foil portion 45) is not particularly limited and may include a variety of methods. Thereafter, the steps as shown in parts (e) to (f) of FIG. 2 are similarly performed to form the semiconductor device 90.

The metal foil portion 45, which protects the region to be attached to the semiconductor element 10, may be electrically connected to the plating lead so as to be electroplated in the process of electroplating the surface 44 of each electrically conductive part 40. Otherwise, the metal foil portion 45 may not be connected to the plating lead. If no electric potential is applied to the metal foil portion 45 in the electroplating process, the plating solution could leach a component from the metal foil portion 45. It is therefore preferred that the metal foil portion 45 is plated.

Alternatively to the etching process, a method of printing a protective coating or the like may be used after the step as shown in FIG. 2 at (b) to form the protective layer 45 on the adhesive layer 31 before the step (2). However, such a method can increase the number of steps. Therefore, the metal foil portion 45 formed by the etching is preferably used to form the protective layer 45.

In the above description with reference to FIGS. 2 and 3, electroplating is used to plate the surface 44 of each electrically conductive part 40. In the plating process, electroless plating may be used in place of the electroplating. In the electroless plating process, the plating lead 47 is unnecessary, and the electrically conductive parts 40 may be electrically independent of each other. Therefore, the step of cutting off the plating lead is unnecessary after the step (4) of forming the molded resin. Such a process provides the semiconductor device as shown in FIG. 1(B). The electroless plating process generally needs the step of protecting, from plating, the portions on which the coating should not be formed and therefore may increase the number of steps. Therefore, the electroplating is preferred.

In the above-described process with reference to FIG. 2, the step (1) of forming the electrically conductive parts on portions of the adhesive layer 31 of the adhesive sheet 30 is performed through the method of attaching the metal foil 41 to the adhesive layer 31. Alternatively, a plating technique may be used to form a metal foil on the adhesive layer 31. For example, all over the surface of the adhesive layer 31 may be thin-plated with metal by electroless plating (generally with an electroless plated thickness of about 0.05 to about 3 μm), and then electroplated to form the metal foil 41 with a desired thickness. Alternatively, vapor deposition or sputtering may be used to form a thin metal layer (generally with a thickness of about 0.05 to about 3 μm) on the adhesive layer 31, and then electroplating may be performed thereon to form the metal foil 41 with a desired thickness.

Alternatively, a photosensitive resist layer may be formed on the adhesive layer 31 of the adhesive sheet 30, subjected to general photolithography using an exposure mask with a certain pattern corresponding to the desired shape and number of the electrically conductive parts, and exposed and developed to form a resist layer with a certain pattern corresponding to the desired shape and number of the electrically conductive parts. In this process, the exposure mask has such a shape that a plating lead will be formed to electrically connect the respective electrically conductive parts 40 for electroplating. Thereafter, thin electroless plating may be performed (generally with an electroless plated thickness of about 0.05 to about 3 μm). The resist layer may be peeled off, and then electroplating may be performed using the plating lead to form the electrically conductive parts 40 with a desired thickness.

On the other hand, vapor deposition or sputtering may be performed to form a thin metal layer 41 (generally with a thickness of about 0.05 to about 3 μm) on the adhesive layer 31 of the adhesive sheet 30. A photosensitive resist layer may be formed on the metal layer 41, subjected to general photolithography using an exposure mask with a certain pattern corresponding to the desired shape and number of the electrically conductive parts, and exposed and developed to form a resist layer with a certain pattern corresponding to the desired shape and number of the electrically conductive parts. In this step, the respective electrically conductive parts 40 may be electrically connected by a plating lead so as to be electroplated. Thereafter, electroplating may be performed with a desire thickness using the plating lead, and the resist layer may be peeled off. Soft etching may then be performed to remove the thin metal layer 41, which has been formed by the vapor deposition or sputtering, to form the electrically conductive parts 40. In this process, a thin copper foil such as MicroThin (trade name of a copper foil, for example, with a thickness of 3 μm, Mitsui Mining & Smelting Co., Ltd.) may be attached to the adhesive layer 31 of the adhesive sheet 30 in place of the very thin metal layer 41 formed by the vapor deposition or sputtering.

Alternatively, the step (1) of forming the electrically conductive parts 40 on portions of the adhesive layer 31 of the adhesive sheet 30 may be performed by a press working method as shown in FIG. 4. Parts (a), (b), (d), and (g) of FIG. 4 show an example of the process in which no protective layer is formed on the adhesive layer 31 before the step (2). Parts (a), (c), (e), (f), and (h) of FIG. 4 show an example of the process in which the protective layer is formed on the adhesive layer 31 before the step (2).

Referring to FIG. 4 at (a), the metal foil 41 is attached to a process film 70. Referring to FIG. 4 at (b) and (c), the metal foil 41 is subjected to press working to have a certain pattern. Referring to FIG. 4 at (d) and (e), the metal foil 41 is then attached to the adhesive layer 31 of the adhesive sheet 30. Thereafter, the process film 70 is peeled off, and the electrically conductive parts 40 are formed (FIG. 4 at (g) and (h)). In FIG. 4 at (f), the metal foil portion 45 serves as the protective layer for protecting the region to be attached to the semiconductor element, before the step (2). After the press working, the electrically conductive parts 40 and the metal foil portion 45 are transferred to the adhesive sheet 30. Therefore, preferred examples of the process film 70 include an adhesive sheet with a weak adhesive strength and an adhesive film whose adhesive strength will be reduced by heating, electron beam or ultraviolet radiation, or the like. In the case that fine working and the like are performed, it is particularly preferred that the process film has a strong adhesion at the time of the working, in which the bonded area is made small, and has a weak adhesion at the time of the transfer. Examples of such a sheet include a heat-foaming peelable tape (ReverAlpha (trade name), Nitto Denko Corporation) and an ultraviolet-curable adhesive sheet (ElepHolder, Nitto Denko Corporation).

Figure 5:
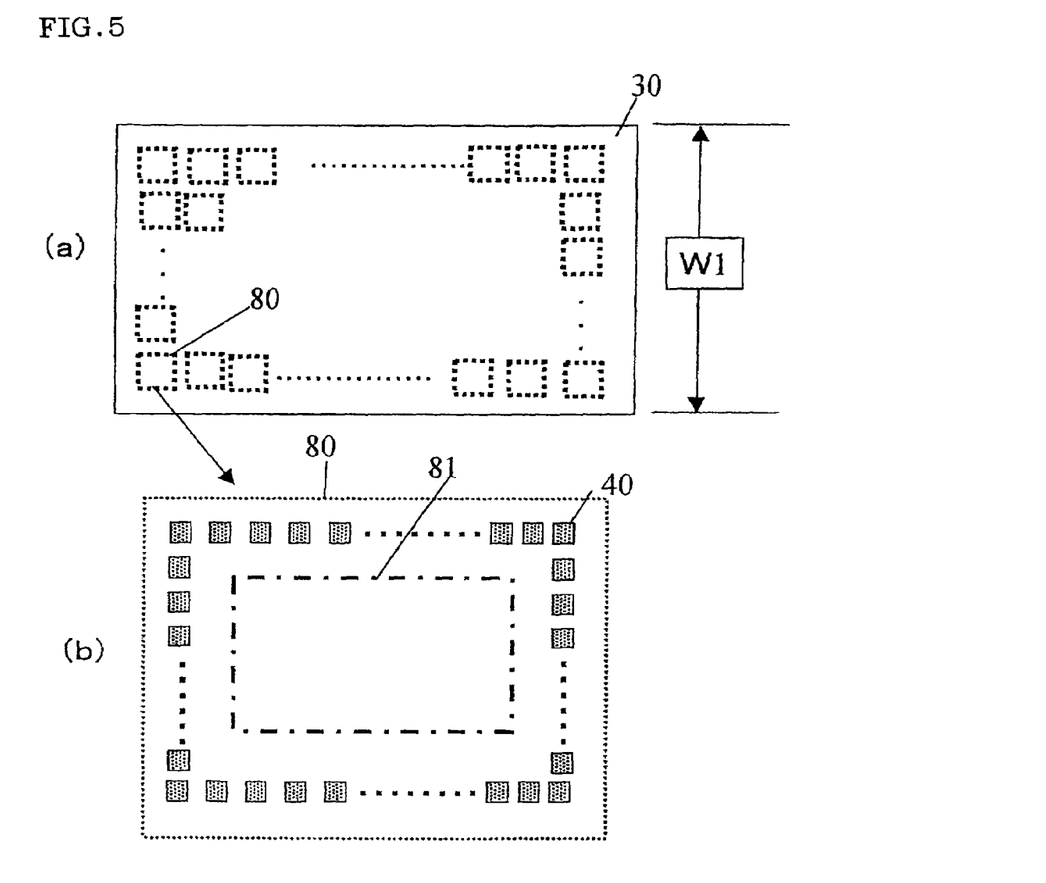
FIG. 5 is a top view showing an adhesive sheet with electrically conductive parts formed in the step (1) of the manufacturing process of the semiconductor device according to this invention.

For easy understanding, a single semiconductor device is manufactured in the above-described process according to this invention. In a practical process, however, a plurality of semiconductor elements is formed at a time as shown in FIG. 5. FIG. 5 at (a) is a plan view schematically showing the adhesive sheet 30. The upper face of the adhesive sheet 30 has a matrix of a large number of blocks 80, wherein each block 80 includes the region to be attached to one semiconductor element and the electrically conductive parts formed around the region. FIG. 5 at (b) is a magnified view of one block 80 in which a desired number of the electrically conductive parts 40 are formed around a region 81 to be attached to the semiconductor element.

In FIG. 5 at (a), for example, the adhesive sheet has a width (W1) of 500 mm. In this example, the sheet is subjected to general photolithography and processed in a metal foil etching apparatus to have the blocks 80 in certain numbers and continuously wound into a roll. At an appropriate time, the resulting adhesive sheet 30 with a width of 500 mm is cut to give a piece that has blocks in certain numbers necessary for the next process including the step (2) of attaching the semiconductor element, the step (3) of wire bonding, and the step (4) of sealing in the resin by transfer molding or the like. After a plurality of the semiconductor elements are sealed in a resin by the transfer molding, the molded resin is cut in a certain size to give semiconductor devices.

In a preferred mode of this invention, the adhesive sheet 30 surely adheres to and holds the semiconductor element 10 and the electrically conductive parts 40 until the resin sealing step (4) is completed and thereafter is easily peeled from the semiconductor device 90. Such an adhesive sheet 30 has the base layer 32 and the adhesive layer 31 as described above. The thickness of the base layer 32 is generally but not limited to from about 12 to about 100 µm, preferably from 25 to 50 µm. The thickness of the adhesive layer 31 is generally but not limited to from about 1 to about 20 µm, preferably 5 to 10 µm. The adhesive sheet may be in the form of an adhesive tape.

The step (4) including the transfer molding step or the like may be performed at a high temperature of about 150 to 180° C. Therefore, the base layer 32 and the adhesive layer 31 should be resistant against such heat. As described above, the base layer 32 preferably has an elastic modulus of 0.3 GPa or more at 150° C. The base layer 32 may be made of an organic material or an inorganic material. If the plating process or the like is performed, the organic material is preferably used. Examples of the organic base material with the above elastic modulus include heat-resistant organic films such as a polyimide film, a polyetherimide film, a polyphenylenesulfide film, a polyester film, and a crosslinked polyethylene film.

Examples of the adhesive for the adhesive layer 31 include thermoplastic adhesives such as rubber based, ethylene copolymer based, or polyimide based adhesives and pressure-sensitive adhesives such as silicone based or acrylic adhesives. Any of these adhesives may be appropriately selected, but the silicone based pressure-sensitive adhesive is preferably used in terms of heat resistance and adhesion. As described above, the adhesive layer 31 preferably has an elastic modulus of 0.1 MPa or more at 150° C. The adhesive strength of the adhesive layer to a silicon mirror wafer is preferably from 0.2 to 10 N/10 mm. The adhesive layer 31 may be reduced in adhesion by the effect of heating, electron beam, ultraviolet light, or the like so as to be easily peeled off in the step (5). Examples of such an adhesive sheet include a heat-foaming peelable tape and an ultraviolet-curable adhesive sheet.

Figure 6:
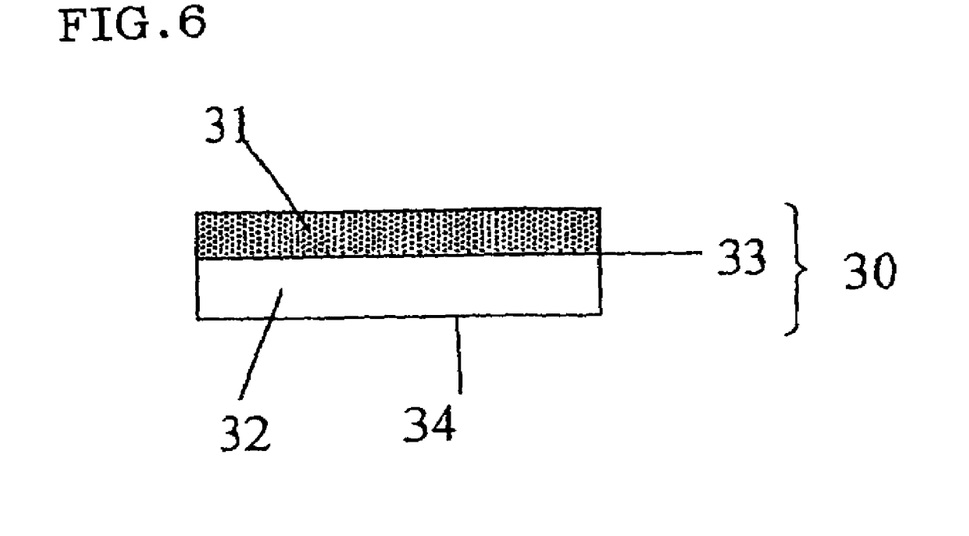
FIG. 6 is a sectional view showing an adhesive sheet for use in the manufacturing process of the semiconductor device according to this invention.

The adhesive sheet 30 may have an antistatic function as needed. Referring to FIG. 6, methods for providing the antistatic function for the adhesive sheet 30 are described. For example, the antistatic function is provided by adding an antistatic agent or an electrically conductive filler to the adhesive layer 31 or the base layer 32. Alternatively, an antistatic agent may be applied to an interface 33 between the base layer 32 and the adhesive layer 31 or to a back surface 34 of the base layer 32. According to the antistatic function, static electricity can be suppressed in the step of separating the adhesive sheet from the semiconductor device. Any agent that can provide the antistatic function may be used without limitation. Examples of the antistatic agent include acrylic amphoteric surfactants, acrylic cationic surfactants, and maleic anhydride-styrene based anionic surfactants. Examples of the material for the antistatic layer include Bondip PA, Bondip PX, and Bondip P (all Konishi Co., Ltd.). Any conventional filler may be used, for example, including metal such as Ni, Fe, Cr, Co, Al, Sb, Mo, Cu, Ag, Pt, and Au; any alloy or oxide thereof; and carbon such as carbon black. One of these materials may be used alone, or two or more of these materials may be used in combination. The electrically conductive filler may be in the form of powder or fiber. In addition, any other known additive such as an antioxidant, a pigment, a plasticizer, a filler, and a tackifier may be added to the adhesive sheet.

EXAMPLES

The method for manufacturing the semiconductor device according to this invention is more specifically described with reference to the examples below.

Example 1

Production of Adhesive Sheet

A silicone-based adhesive (SD-4587L, Toray Dow Corning Co., Ltd.) was applied onto a polyimide film with a thickness of 25 μm and a width of 500 mm (Kapton® H, Du Pont-Toray Co., Ltd.) and then dried at 150° C. for 3 minutes to form an adhesive sheet having an adhesive layer with a thickness of 5 μm. The adhesive layer of the adhesive sheet had an elastic modulus of 0.15 MPa at 150° C. and an adhesive strength of 0.25 N/10 mm to a silicon mirror wafer. The polyimide film used as the base layer had an elastic modulus of 1.8 GPa at 150° C.

Fabrication of Semiconductor Device

Figure 7:
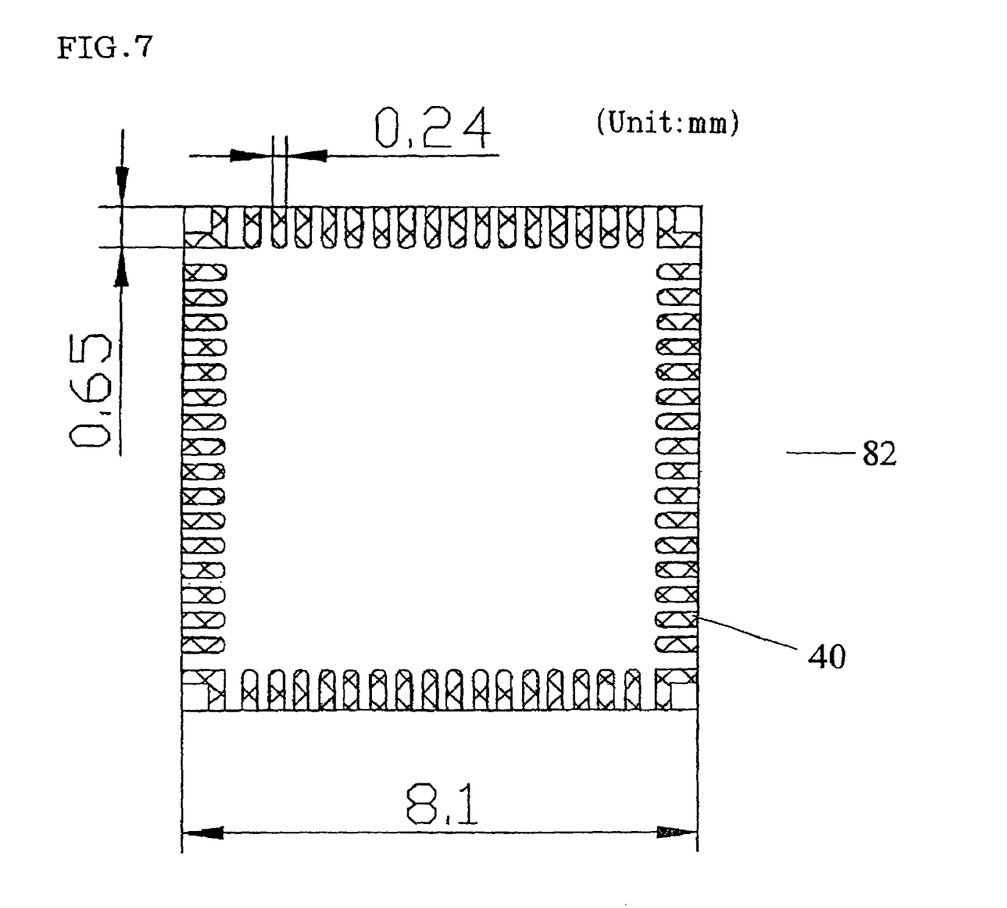
FIGS. 7 and 8 are top views each showing an adhesive sheet with electrically conductive parts formed in the process of Examples.
Figure 8:
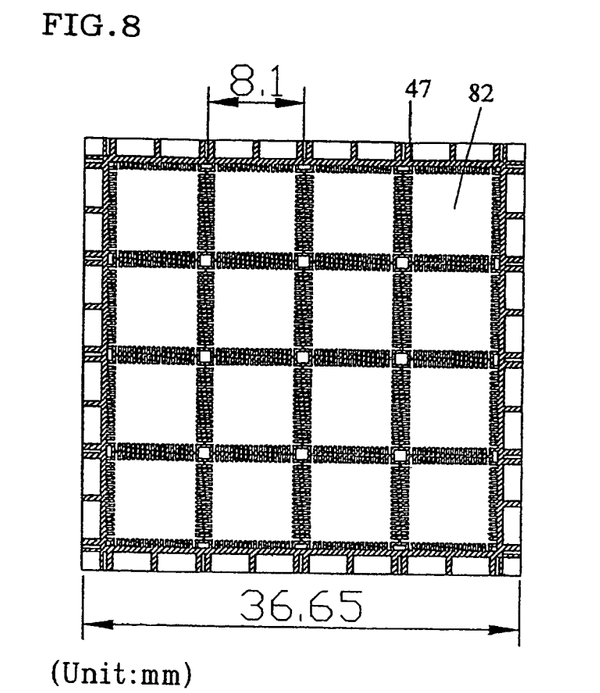

A copper metal foil with a thickness of 35 μm (BHY-138T, Japan Energy Corporation) was attached to the adhesive layer of the adhesive sheet to form a flexible metal-attached adhesive sheet. After pattern etching, one block corresponding to each block 80 (with a W1 of 500 mm) as shown in FIG. 5 had an arrangement of the electrically conductive parts 40 as shown in FIG. 7. Referring to FIG. 7, 16 electrically conductive parts 40 are formed on each side of the rectangle, and a total of 64 electrically conductive parts 40 are formed. The metal foil was etched using general photolithography to have a plurality of blocks 82. As a result, electrically conductive parts electrically connected by a plating lead 47 (not shown in FIG. 7 but shown in FIG. 8) were formed. FIG. 8 shows 16 blocks 82 formed by pattern etching. The plating lead 47 is formed so as to connect all the electrically conductive parts 40. Thereafter, general electroplating was performed to form Ni/Au plated layers (Ni thickness: 5 μm, Au thickness: 1 μm) on the electrically conductive parts 40. The metal-attached sheet as shown in FIG. 8 was then cut into fragments each having a matrix of 4 by 4 blocks 82. The fragment with 4 by 4 blocks 82 was named a unit.

Test aluminum vapor-deposited silicon chips each in a size of 6 mm×6 mm were then each fixed to the adhesive layer surface (a prescribed mounting face corresponding to the portion 81 in FIG. 5 at (b)) of the adhesive sheet at room temperature. A gold wire with a diameter of 25 μm was used to wire-bond each electrode of the silicon chips to each electrically conductive part. The number of the bonded wire was 64 per chip.

The wire bonding was performed on ten units (each with the matrix of 4 by 4) including 160 aluminum vapor-deposited chips. The wire bonding had a 100% success rate. Subsequently, transfer molding was performed to mold a molding resin (HC-100, Nitto Denko Corporation). After the resin molding, the adhesive sheet was peeled off at room temperature. Post cure was then performed in a drier at 175° C. for 5 hours. A dicing saw was then used to cut each unit into one-block pieces, and semiconductor devices were obtained.

The inside of the resulting semiconductor devices was observed using a soft X-ray apparatus (a micro-focus X-ray television radioscopic apparatus SMX-100, Shimadzu Corporation). As a result, it was proved that the resulting semiconductor devices had no deformed wire, no shifted chip or the like.

Example 2

The process of Example 1 was used to form semiconductor devices except that the metal foil used was a copper-nickel alloy foil with a thickness of 18 μm (C7025, Japan Energy Corporation). The wire bonding had a 100% success rate. The observation of the inside of the resulting semiconductor devices proved that they had no deformed wire, no shifted chip, or the like.

Wire Bonding Conditions
  Apparatus: UTC-300BI SUPER (Shinkawa Ltd.)
  Ultrasonic Frequency: 115 kHz
  Ultrasonic Output Time: 15 milliseconds
  Ultrasonic Output Power: 120 mW
  Bond Load: 1.18 N
  Search Load: 1.37 N Transfer Molding Conditions
  Apparatus: TOWA Molding Machine
  Molding Temperature: 175° C.
  Time: 90 seconds
  Clamp Pressure: 200 kN
  Transfer Speed: 3 mm/second
  Transfer Pressure: 5 kN Elastic Modulus Determining Method
  The elastic modulus of the base layer and the adhesive layer were measured under the following conditions:
  Evaluation System: Rheometrics Viscoelastic Spectrometer (ARES)
  Temperature Rise Rate: 5° C./min
  Frequency: 1 Hz
  Measurement Mode: Tensile Mode Adhesive strength Measuring Method The adhesive sheet with a width of 10 mm and a length of 50 mm was laminated on a silicon mirror wafer (CZN<100>2.5–3.5 (4 inch) (product name), Shin-Etsu Handotai Co., Ltd.) under the conditions of 150° C., 0.5 MPa, and 0.5 m/min and then allowed to stand in a hot-air oven at 150° C for 1 hour. The adhesive sheet was then pulled in a 180° direction at a pulling rate of 300 mm/min under the atmospheric conditions of a temperature of 23° C. and a humidity of 65% RH, and the center value obtained in the test was determined as the adhesive strength.

Wire Bonding Success Rate

A bonding tester PTR-30 (Rhesca Co., Ltd.) was used to measure a pull strength of each bonded wire under the conditions of a measurement mode of pull test and a measurement speed of 0.5 mm/sec. The case with a pull strength of 0.04 N or more was evaluated as "success," and the case with a pull strength of less than 0.04 N "failure." The wire bonding success rate was calculated from the measurements as a percentage of the "success" cases.

In the method for manufacturing the semiconductor device according to this invention, a relatively thick semiconductor wafer can be used to form thin semiconductor devices. According to this invention, the semiconductor element can be free from dislocation in the process, and semiconductor devices can be produced by a relatively small number of steps at a relatively low cost.

What is claimed is:

1. A semiconductor device chip having a top plane and a bottom plane, comprising:
   a semiconductor element having electrodes;
   electrically conductive parts each electrically connected to each electrode of the semiconductor element by a wire; and
   a sealing resin with which an electrode side of the semiconductor element and a wired side of each electrically conductive part are sealed, wherein no semiconductor element or no electrically conductive parts are exposed on the top plane, and an electrode-free side of the semiconductor element opposite to the electrode side thereof, an unwired side of each electrically conductive part opposite to the wired side thereof, and the sealing resin are exposed on the bottom plane.

2. The semiconductor device chip according to claim 1, which has a side plane, wherein the conductive part has an inner side facing the semiconductor element and an outer side opposite to the inner side, said outer side being exposed on the side plane.

3. The semiconductor device chip according to claim 1, which has a side plane, wherein the conductive part has an inner side facing the semiconductor element and an outer side opposite to the inner side, no outer side being exposed on the side plane.

4. The semiconductor device chip according to claim 1, wherein a thickness between the top plane and the bottom plane is about 110 µm to about 250 µm.

5. The semiconductor device chip according to claim 1, wherein the electrically conductive parts are arranged on the bottom plane in a rectangular shape surrounding the semiconductor element.

6. The semiconductor device chip according to claim 5, wherein multiple electrically conductive parts are arranged on each side of the rectangular shape.

7. A series of semiconductor devices, comprising:
    a plurality of semiconductor elements having electrodes;
    a plurality of electrically conductive parts formed around each of the semiconductor elements, wherein each of the electrically conductive parts and each of the electrodes of the semiconductor element are electrically connected by a plurality of wires; and
    a sealing resin in which the plurality of semiconductor elements and the plurality of electrically conductive parts are sealed and an electrode-free side of each semiconductor element and an unwired side of each electrically conductive part are formed on a single flat surface of a removable substrate.

8. The series of semiconductor devices according to claim 7, wherein the plurality of electrically conductive parts are arranged on the removable substrate in a rectangular shape surrounding each semiconductor element.

9. The series of semiconductor devices according to claim 8, wherein multiple electrically conductive parts are arranged on each side of the rectangular shape.

10. The series of semiconductor devices according to claim 7, which are disposed in a lattice design on the removable substrate.

11. The series of semiconductor devices according to claim 7, which is produced by a method comprising:
    preparing the removable substrate comprising a base layer and an adhesive layer;
    forming a plurality of blocks on the adhesive layer of the removable substrate, each of the blocks having (i) a region to which one semiconductor element is to be attached and (ii) a plurality of electrically conductive parts formed around the region;
    attaching one semiconductor element having electrodes to each of said regions so that an electrode-free side of the semiconductor element is attached to the adhesive layer;
    electrically connecting each of the plurality of electrically conductive parts and each of the electrodes of the semiconductor element by a plurality of wires each block;
    sealing the electrically connected semiconductor elements in a sealing resin to form a series of semiconductor devices on the removable substrate; and
    separating the removable substrate from the semiconductor devices.

12. The series of semiconductor devices according to claim 11, wherein the base layer of the removable substrate has an elastic modulus of 0.3 GPa or more at 150° C., and the adhesive layer of the removable substrate has an elastic modulus of 0.1 MPa or more at 150° C.

13. The series of semiconductor devices according to claim 11, wherein the adhesive layer of the removable substrate has an adhesive strength of 0.2 to 10 N/10 mm to a silicon mirror wafer.

* * * * *

UNITED STATES PATENT AND TRADEMARK OFFICE
CERTIFICATE OF CORRECTION

PATENT NO. : 7,235,888 B2
APPLICATION NO. : 11/032290
DATED : June 26, 2007
INVENTOR(S) : Kazuhito Hosokawa et al.

It is certified that error appears in the above-identified patent and that said Letters Patent is hereby corrected as shown below:

At Column 11, Line 6, please delete "(Kapton® H," and insert --(Kapton®H,--, therefor.

At Column 12, Line 33 (approximately), please delete "150° C." and insert --150° C--, therefor.

Signed and Sealed this

Tenth Day of June, 2008

JON W. DUDAS
*Director of the United States Patent and Trademark Office*